US006881686B1

(12) United States Patent
Sposili et al.

(10) Patent No.: US 6,881,686 B1
(45) Date of Patent: Apr. 19, 2005

(54) LOW-FLUENCE IRRADIATION FOR LATERAL CRYSTALLIZATION ENABLED BY A HEATING SOURCE

(75) Inventors: Robert S. Sposili, Portland, OR (US); Mark A. Crowder, Portland, OR (US); Apostolos T. Voutsas, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/805,120

(22) Filed: Mar. 19, 2004

Related U.S. Application Data

(63) Continuation-in-part of application No. 10/713,383, filed on Nov. 13, 2003.

(51) Int. Cl.[7] .................. H01L 21/26; H01L 21/324; H01L 21/42
(52) U.S. Cl. .................. 438/795; 438/149; 438/486
(58) Field of Search .................. 438/795, 799, 438/149, 486, 487

(56) References Cited

U.S. PATENT DOCUMENTS

| | | | |
|---|---|---|---|
| 5,346,850 A | * | 9/1994 | Kaschmitter et al. ....... 438/487 |
| 5,817,550 A | * | 10/1998 | Carey et al. ................ 438/166 |
| 6,495,405 B1 | | 12/2002 | Voutsas et al. |
| 6,590,228 B1 | | 7/2003 | Voutsas et al. |
| 6,635,554 B1 | | 10/2003 | Im et al. |
| 6,635,555 B1 | | 10/2003 | Voutsas |
| 6,645,454 B1 | | 11/2003 | Voutsas |
| 2003/0003636 A1 | * | 1/2003 | Grigoropoulos et al. .... 438/149 |

FOREIGN PATENT DOCUMENTS

JP          2002280391 A  *  9/2002   ......... H01L/21/336

OTHER PUBLICATIONS

Proceeding entitled, "$CO_2$ Laser Crystallization of Silicon on Bulk Fused Silica", by Hawkins et al., published in Material Research Society Symposia Proceedings vol. 4, pp 529–534, 1982.

* cited by examiner

*Primary Examiner*—Caridad Everhart
(74) *Attorney, Agent, or Firm*—Matthew D. Rabdau; David C. Ripma; Joseph P. Curtin

(57) ABSTRACT

A process of lateral crystallization comprises providing a silicon film on a substrate surface, exposing a localized substrate region at the substrate surface to a laser heating source, and annealing a portion of the silicon film in thermal contact with the localized substrate region by exposing the silicon film to a low-fluence optical annealing source.

19 Claims, 4 Drawing Sheets

LOW-FLUENCE IRRADIATION FOR LATERAL CRYSTALLIZATION ENABLED BY A HEATING SOURCE

CROSS-REFERENCE

This application is a continuation-in-part of U.S. patent application Ser. No. 10/713,383, filed on Nov. 13, 2003, entitled Method and Process for Long Crystal Lateral Growth in Silicon Films by UV and IR Pulse Sequencing, which is incorporated herein by reference.

BACKGROUND OF THE INVENTION

The present invention relates generally to methods of forming polycrystalline thin films and, more particularly, to methods using optical annealing and lateral crystallization.

Polycrystalline silicon thin films are used to form thin-film transistors (TFTs) for pixel-switching elements and other integrated circuits that are simultaneously fabricated on display substrates. These thin films and TFTs can provide for the fabrication of integrated circuits on various substrates, for example, glass, plastic, or metal. These thin films and TFTs may also be used for non-display applications as well. Possible non-display applications include, sensors, ASICS, memory modules, or printer heads, for example.

Polycrystalline silicon, also known as poly-Si, films may be produced by crystallizing amorphous silicon, or microcrystalline silicon. Quality poly-Si films can be produced using lateral growth processes, also referred to as lateral crystallization. Quality poly-Si films can then be used to produce high performance poly-Si TFTs. The quality of the films and the resulting TFTs depends to a great extent on the crystal characteristics.

DETAILED DESCRIPTION OF THE INVENTION

A theoretical study of the physics of optical annealing reveals that the lateral growth length (LGL) is related to the time that the molten Si film can remain at, or slightly above, a temperature range that prohibits nucleation from occurring within undercooled, molten silicon. The temperature range below which nucleation occurs at a non-negligible rate may be referred to herein as the nucleation temperature. The temperature of the Si during crystallization depends, in part, on the rate of heat loss from the irradiated domain. The irradiated domain refers to that portion of the silicon film that is irradiated during optical annealing. Slower heat loss will correspond to a longer time period at, or above, the nucleation temperature. The longer the time period that the Si within the irradiated domain is above the nucleation temperature, the longer the resulting lateral growth length will be.

Figure 1:
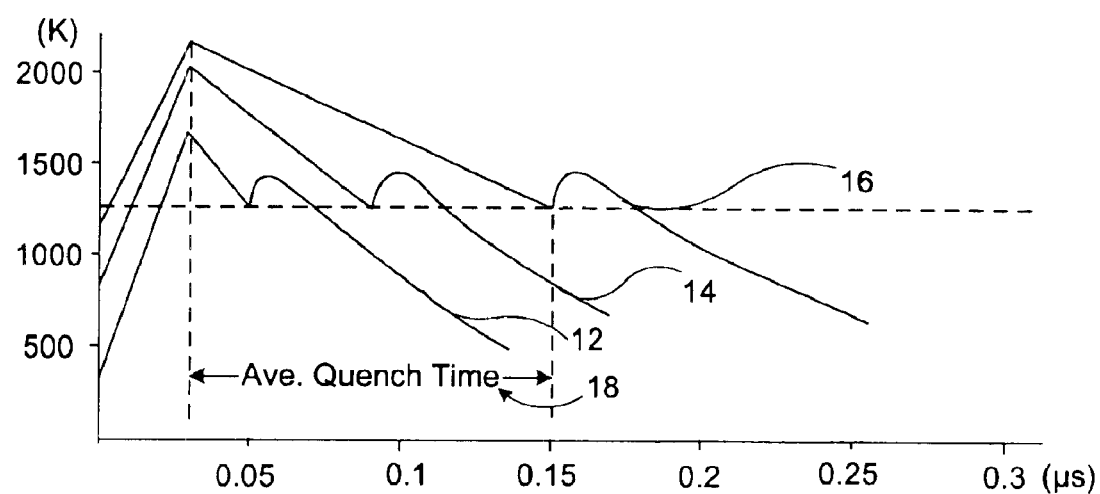
FIG. 1 is a temperature history plot for a silicon film.

Increasing the steady-state temperature of the substrate will reduce the rate of heat loss from the cooling molten-Si film. FIG. 1 illustrates a temperature history of laser-irradiated Si films corresponding to three substrate temperatures. Temperature history refers to a plot of temperature versus time at a specific location within the irradiated domain. FIG. 1 shows plots of the temperature history at the surface of an irradiated domain of Si film. The first temperature history 12 is for a silicon film over a substrate at room temperature, about 300 K. The second temperature history 14 is for a silicon film over a substrate at about 900 K. The third temperature history 16 is for a silicon film over a substrate at about 1200 K. Generally, the three plots show some common patterns for films irradiated by a laser pulse. The laser pulse heats the Si film rapidly increasing its temperature within several nanoseconds, melting the irradiated region of the Si film. The laser pulse may be between 10 and 300 nanoseconds long, and was 30 nanoseconds in the examples shown in FIG. 1. Pulses longer than 300 nanoseconds may also be used, but may be limited by heat damage to the substrate or the agglomeration threshold of the Si film. Once the laser pulse ends, the temperature of the molten Si film continues to climb, in response to the energy that has been pumped into the film by the laser pulse until a maximum temperature is reached. The temperature value at the maximum point depends on several factors, including the optical fluence, the substrate temperature, the pulse duration, and the film thickness, along with other factors. Since heat is removed by conduction through the bottom of the irradiated domain, and the surrounding unmelted film, as well as radiation from the top surface, the temperature of the irradiated domain will reach its maximum value and then decline as heat is removed from the irradiated domain. Conduction tends to dominate the heat removal process. As the temperature in the molten Si region falls below the formal melting point of the film, lateral growth occurs in the film. The formal melting point refers to the established melting point of a bulk material, for example bulk silicon. The molten Si that exists at temperatures below its formal melting point is referred to as undercooled liquid. Such liquid can exist at temperatures substantially below the formal melting point for a finite period of time. For example, crystalline silicon has a formal melting point of 1410° C., yet undercooled Si can exist at temperatures as low as approximately 900° C. Lateral growth continues as the temperature continues to decline. However, the probability of nucleation is related to the amount of undercooling in the molten-Si. The lower the temperature of an undercooled liquid, the higher the probability of nucleation occurring within the liquid molten-Si. Nucleation disrupts the lateral growth process and thereby limits the lateral growth length. When nucleation occurs, release of latent heat momentarily increases the temperature in the recrystallized Si film, which manifests as a hump on the temperature history. Although the nucleation temperature is not fixed, since nucleation is a stochastic process of temperature and time, it is possible to identify a temperature band within which the probability for nucleation is high enough to interfere with lateral crystallization processes. This band has been empirically determined to be in the range of between approximately 1200 K and 1300 K. The horizontal dashed line in FIG. 1 corresponds approximately to the center of this band. After the molten Si film completely transforms to solid-Si, by pure lateral growth or a combination of lateral growth and nucleation processes, the temperature continues to drop as shown in FIG. 1.

Comparing the three temperature history plots at three different substrate temperatures shows the profound effect that the temperature of the substrate has on the characteristics of the temperature history of the film. Higher substrate temperatures prolong the average quench time, which is the time the molten-Si remains at temperatures above the band corresponding to high nucleation probability. The average quench time 18 for the case of the substrate at approximately 1200 K is shown. The higher substrate temperature also decreases the solidification velocity, which is the velocity of the advancing solid interface. Decreasing the solidification velocity reduces the propensity of the material for defect formation. The higher substrate temperature also increases the sub-boundary spacing. Sub-boundary spacing on the order of 2–5 $\mu$m can be obtained as the substrate temperature approaches the Si melting point. In contrast, the sub-boundary spacing is only on the order of 0.2–0.5 $\mu$m for substrate temperatures corresponding to room temperature. The longer the film is maintained below the formal melting point, but above the band corresponding to high nucleation probability, the longer the LGL achieved.

Figure 2:
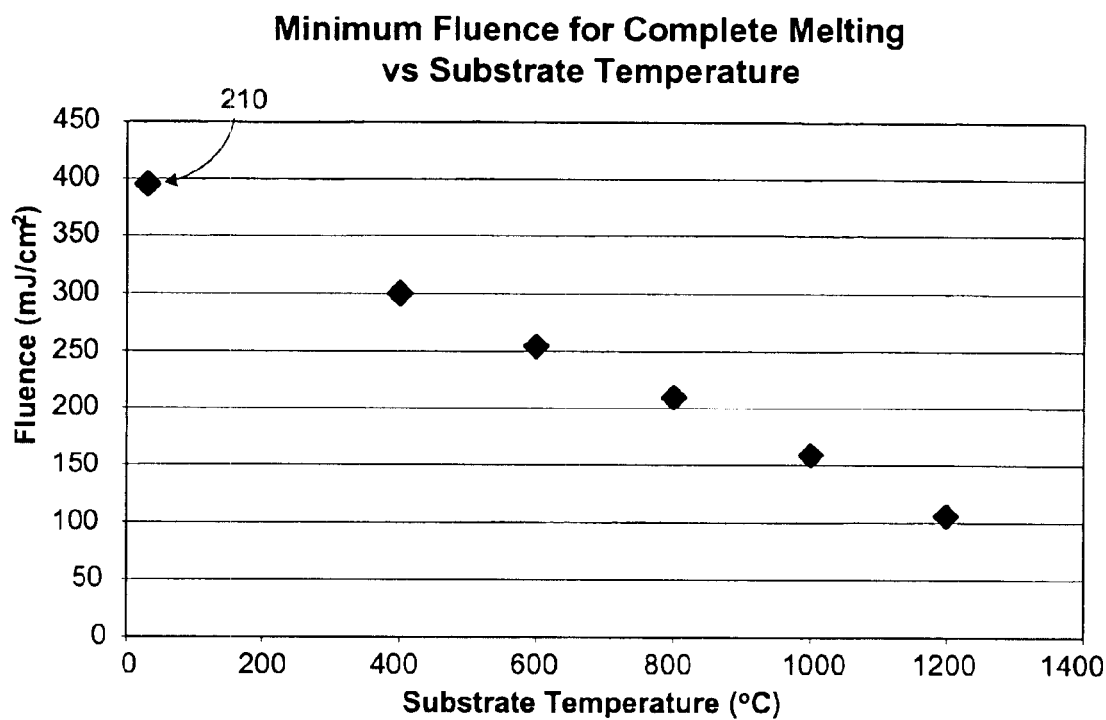
FIG. 2 is chart showing minimum fluence required for complete melting as a function of substrate temperarture.

Another benefit of increased substrate temperature has been identified. As shown in FIG. 2, the minimum optical fluence required for complete melting of the irradiated portion of the silicon film decreases as a function of substrate temperature. FIG. 2 is based upon a simulation model for a 50-nm-thick silicon film using a 28-ns excimer laser pulse. At room temperature (298 K), corresponding to point 210, the minimum fluence required to completely melt the 50 nm thick silicon film is 395 mJ/cm$^2$, as shown in FIG. 2, based upon the simulation. Typical prior art lateral crystallization processes use an excimer laser at approximately 500 mJ/cm$^2$.

Although excimer lasers are currently the preferred annealing source for optical crystallization applications, other annealing source may become more viable once the fluence requirement is reduced.

Excimer lasers have wavelengths in the UV range that are well suited for the purpose of annealing thin silicon films because these wavelengths are strongly absorbed by silicon. Excimer lasers emit short pulses, typically with full width at half maximum (FWHM) of approximately 30 ns. These short pulses are effective in introducing the necessary amount of energy into the silicon film rapidly without causing excessive temperature increase in the underlying substrate. For many applications, the substrate will be some composition of glass, which can only withstand sustained temperatures no higher than 600° C. By comparison, it is necessary to induce temperatures on the order of 1400° C. through 1600° C. in the silicon film itself in order to induce melting and recrystallization. It is possible to do this without damaging the substrate using an excimer laser. The excimer laser has the highest output power among current readily available UV sources. Higher power means that a larger beam area can be used with the fluence required to achieve the complete melting threshold of the silicon film. Accordingly, higher power means improved throughput.

Although excimer lasers are currently the preferred annealing source, excimer lasers also have some drawbacks. Excimer lasers have a relatively high initial cost, along with high maintenance and operating costs, as compared with other optical sources, such as lamps and solid-state lasers. Frequency-multiplied pulsed solid-state lasers have been considered as possible replacements for excimer lasers. These lasers emit wavelengths in the UV and visible part of the electromagnetic spectrum, which can be well matched to the silicon absorption spectrum. They can also emit short pulses that allow silicon to be annealed without excessively heating the substrate. They are able to operate at higher repetition rates than high-power excimer lasers. Solid-state lasers can have repetition rates on the order of 10s or 100s of kilohertz, while excimer lasers are typically limited to on the order of 300 Hz operation. Solid-state lasers are typically much smaller, less expensive to own and operate, and require less maintenance than excimer lasers.

One of the problems with replacing excimer lasers with other sources, such as pulsed solid-state lasers, or UV lamps, is that these optical sources have not been readily available with the output power desired. The necessary fluence could be achieved by concentrating the beam to a reduced area. However, reducing beam area reduces throughput. As indicated by FIG. 2, if the substrate temperature is increased, the minimum fluence required for complete melting decreases. So if a higher substrate temperature is used, lower fluence sources become more viable. Lower power optical sources may be used to produce the necessary fluence without significantly reducing the beam area.

Although the benefits of using a high substrate temperature, for example greater than 1200 K, are clear, these temperatures are incompatible with glass substrates commonly used for display substrates. It is impractical to maintain display glass at steady state temperatures that exceed approximately 600° C.

However, if the period of heating is sufficiently short and the heated area sufficiently small, the high temperature will not cause significant damage to the substrate while still providing some of the benefits of higher substrate temperatures. For example, if the glass substrate immediately under the irradiated domain of the Si were heated for a sufficiently short period of time, the benefits of higher substrate temperature can be obtained, without causing significant substrate damage. Significant damage means substrate damage sufficient to prevent further processing, or render the substrate wholly unusable for its intended purpose. A certain amount of degradation of the substrate may therefore be acceptable, even if it may affect performance parameters or production yield.

In one embodiment of the present method, an optical source is used to irradiate the silicon film, and a laser heating source is used to heat the underlying substrate. Since Si absorbs strongly in the UV-visible range, for example below 0.8 $\mu$m, the optical annealing source will preferably emit in this UV-visible range. SiO$_2$, and glass, such as borosilicate glass, for example CORNING 1737, absorb strongly in the far-IR region, from about 9 to 11 $\mu$m. The laser heating source preferably emits in this far IR region. CO$_2$ lasers are commercially available at wavelengths of 10.6 $\mu$m, which make them suitable candidates for the laser heating source.

The primary parameters that control the peak temperature and temperature history of a substrate for a single CO$_2$ laser pulse include the instantaneous power (energy/time), the instantaneous power density (instantaneous power/area), and the fluence (instantaneous power density times pulse duration, which correponds to energy/area/pulse). In some laser systems the instantaneous power is a fixed parameter. In this case, the instantaneous power density (IPD) can be adjusted by adjusting the beam area. Similarly, the fluence can be adjusted by adjusting the beam area and by controlling the pulse duration. Decreasing the beam area increases both the IPD and the fluence. However, the fluence can be controlled independently from the IPD by adjusting the laser pulse duration.

If multiple laser pulses are being used to heat the substrate, the average power density may also affect the temperature history. The average power density corresponds to the fluence times the repetition rate, which also corresponds to the instantaneous power density times the duty cycle. The duty cycle is the fraction of time that the $CO_2$ laser is actually firing. The average power density can be controlled by adjusting the beam area, which affects both the fluence and the IPD, by adjusting the pulse width, which affects the fluence, or by adjusting the repetition rate, which affects the duty cycle and the average power density independent of the fluence or the IPD.

In sequential lateral solidification processes, the annealing optical source, for example a laser, is moved by a scanning distance, which is some fraction of the lateral growth length (LGL) between annealing exposures. If the substrate is continuously scanned, the annealing optical source may be fired as the desired scanning distance is reached. In an embodiment of the present method, the $CO_2$ laser may be scanned along with the annealing exposure. This results in a given region of the substrate being exposed multiple times as the scan progresses. Accordingly, the cumulative average power density will affect the temperature history of the substrate. The cumulative average power density is the average power density times the number of shots that a given point is exposed to. In an embodiment of the present method, wherein there is one $CO_2$ laser shot per annealing shot, the number of shots is defined by the distance across the beam in the scanning direction divided by the step size of the $CO_2$ laser.

In another embodiment, multiple $CO_2$ laser shots will be made between annealing shots as the substrate is continuously scanned. In this case, the number of shots is still determined by the distance across the beam in the scanning direction divided by the step size of the $CO_2$ laser. The $CO_2$ laser may not have the same step size or distance across the beam as the annealing source.

In another embodiment, the substrate is scanned in discrete steps and multiple $CO_2$ laser shots will be made between annealing shots. In this case, the number of shots may be determined by multiplying the number of $CO_2$ laser shots between scanning steps times the distance across the $CO_2$ beam in the scanning direction divided by the $CO_2$ laser step size.

Figure 3:
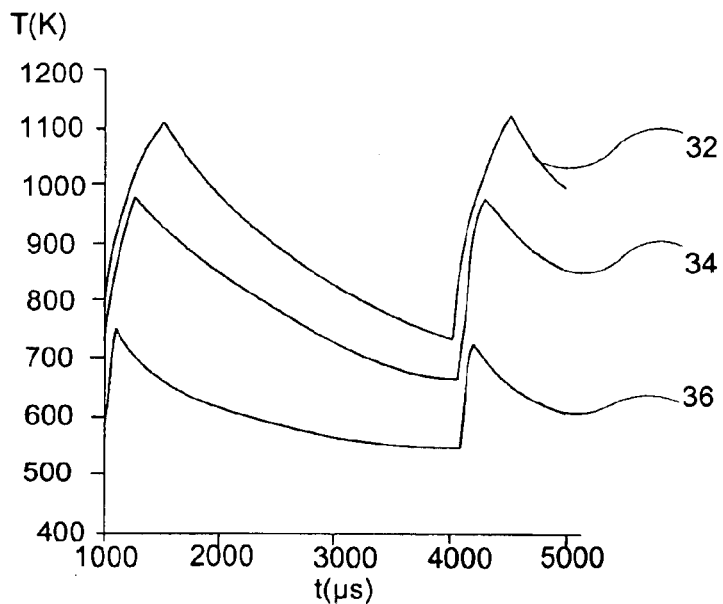
FIG. 3 is a temperature history plot for an $SiO_2$ substrate.

FIG. 3 shows the temperature history for three pulses, using a 1 $mm^2$ beam area for these examples. The pulses are characterized by pulse duration and fluence. The first curve 32 corresponds to a 400 $\mu s$ pulse at 15 $mJ/mm^2$. The second curve 34 corresponds to a 400 $\mu s$ pulse at 10 $mJ/mm^2$. The third curve 36 corresponds to a 100 $\mu s$ pulse at 4 $mJ/mm^2$. From these given values for each example pulse, it would be possible to calculate the IPD. For these examples the time between pulses was approximately 3 ms, so the average power density may also be determined. The instantaneous power was not fixed for the purpose of these examples, which illustrate achievable temperatures and the effect of certain control parameters on the temperature histories. The temperature histories shown in FIG. 3 do not take into account substrate scanning.

By reviewing a temperature history, similar to those shown in FIG. 3, it will be possible to estimate an effective substrate temperature range within which the annealing process will occur. According to an embodiment of the present process, the Si film and any supporting layers, including an $SiO_2$ substrate, a glass substrate, or an $SiO_2$ layer overlying a glass substrate, in contact with the Si film, are irradiated by two localized irradiation sources. One source is a UV-visible source suitable for crystallizing the Si film, also referred to as the annealing source. The other source is suitable for heating the $SiO_2$ substrate, and may be referred to herein as the heating source. The two sources have a temporal offset, which may be used to select the effective substrate temperature for the irradiated domain for a known peak temperature and temperature history.

In one embodiment, for example, a $CO_2$ laser is used as a laser heating source to heat the $SiO_2$ layer under the Si film. The Si film is irradiated using an optical annealing source. Due to the reduced fluence requirements for the optical annealing source at higher substrate temperatures, a variety of sources may be used as the annealing source.

In one embodiment, the annealing source is an excimer laser. A XeCl laser at 308 nm or a KrF laser at 248 nm are possible candidates for the excimer laser. Due to the lower fluence requirement, the beam may be expanded to cover a larger area, possibly improving throughput. The reduced fluence requirement may enable 1:1 projection.

In another embodiment, the annealing source is a frequency-doubled solid-state laser. Frequency-doubled solid-state lasers, such as doubled Nd-YAG lasers operating at 532 nm or doubled Nd-$YVO_4$ lasers, are possible candidates for the visible laser.

In another embodiment, the annealing source is a frequency-tripled solid-state laser. Frequency-tripled solid-state lasers, such as tripled Nd-YAG lasers or tripled Nd-$YVO_4$ lasers, are also possible candidates for the UV laser.

Potential problems exist for solid-state lasers due to their higher optical coherence as compared to excimer lasers, which may cause imaging problems. These problems can be overcome by known optical methods.

In another embodiment, a UV lamp source, such as a mercury arc lamp is used as the annealing source. The UV lamp source has a suitable wavelength for annealing applications, as well as low-coherence preferred for imaging. The UV lamp source can be chopped, either mechanically or optically, to produce a pulsed beam if desired. UV lamp sources are much less expensive than lasers and far less costly to operate than excimer lasers. UV lamp sources have been used extensively in photolithography tools, so they are already well established within the semiconductor industry. In the past UV lamp sources have not been considered suitable for annealing applications, because they could not readily achieve the necessary fluence. Once the fluence required is reduced by substrate heating, UV lamp sources become viable as annealing sources. Conventional UV lamps, such as high-pressure mercury or mercury-xenon arc lamps, may be used an annealing sources. The UV lamp source may be chopped to produce short pulses on the order of hundreds of nanoseconds, or less. Alternatively, the UV lamp source may be used without producing these short pulses. If the fluence of the UV lamp source is low enough that it will have a negligible effect on the film by itself, the complete melting of the film that is required for lateral crystallization will occur only when the film is heated by the heating source. A continuous UV lamp source could be used in situations where complete melting would occur only when the heating source pulse caused the substrate temperature to reach a level where the UV lamp source would be capable of completely melting the silicon film. Without the heating source, the UV lamp would heat the film, but would have no discernable effect on the crystal structure of the film.

Figure 4:
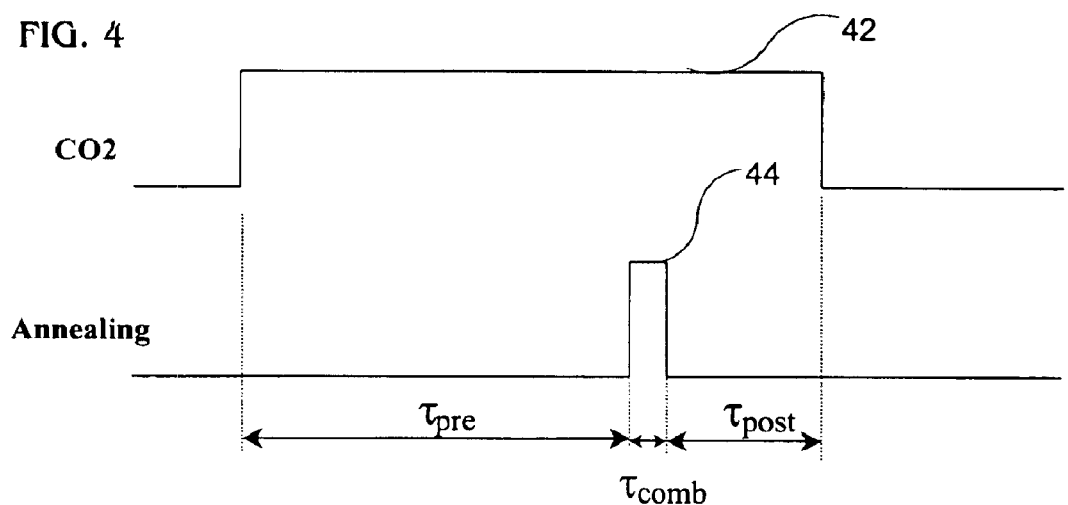
FIG. 4 illustrates a process sequence.

FIG. 4 schematically illustrates one embodiment of the present process. Two idealized optical pulses are shown. The $CO_2$ laser pulse 42 starts and heats the $SiO_2$ substrate. Some time later the annealing source pulse 44 irradiates the Si layer to crystallize it. The time between the start of the $CO_2$ laser pulse and the start of the annealing source pulse, also known as the temporal offset ($\tau_{pre}$), can be used to establish the effective substrate temperature at the time of the annealing source pulse for a given temperature history. In this example, both the $CO_2$ laser pulse and the annealing source pulse are irradiating the same area at the same time for a period of combined irradiation, $\tau_{comb}$. During $\tau_{comb}$, it is possible for the molten-Si film to absorb energy from both the annealing source and the $CO_2$ laser. This is because although solid Si is practically transparent to IR radiation, molten-Si absorbs IR radiation. The total fluence of the two beams may need to be adjusted to avoid agglomeration of the Si film. The $CO_2$ laser pulse may remain on for a period, $\tau_{post}$, after the annealing pulse has ended. Some absorption from the $CO_2$ laser pulse may continue to occur within the molten-Si film. This absorption, along with the elevated substrate temperature reduces the quenching rate in the Si film and increases the effective time period for lateral growth, thereby increasing the maximum possible lateral growth length.

Figure 5:
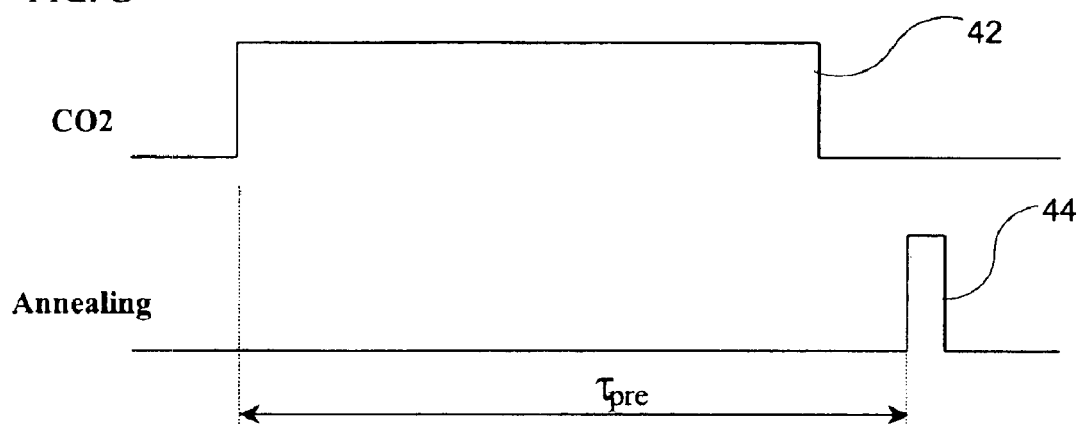
FIG. 5 illustrates a process sequence.

FIG. 5 schematically illustrates another embodiment of the present process. Two idealized optical pulses are shown. The $CO_2$ laser pulse 42 starts and heats the $SiO_2$ substrate. Some time after the $CO_2$ laser pulse ends the annealing source pulse 44 irradiates the Si layer to crystallize it. The time between the start of the $CO_2$ laser pulse and the start of the annealing source pulse, also known as the temporal offset ($\tau_{pre}$), can be used to establish the effective substrate temperature at the time of the annealing source pulse for a given temperature history of the substrate based on the $CO_2$ laser parameters. Since there is no overlap between the two optical pulses, the Si film will absorb radiation from the annealing source pulse separately from the $CO_2$ laser. The Si film will be effectively transparent to the $CO_2$ laser pulse and so will not absorb a significant amount of the $CO_2$ laser pulse. This scheme decouples the effect of the two different sources, while still providing an effective substrate temperature that will prolong the quenching time. Assuming that the fastest of the two optical sources discharges at a frequency (f), the temporal offset ($\tau_{pre}$) between the two pulses will be loosely constrained by the following relations: $\tau_{CO2} \leq \tau_{pre} < 1/f - \tau_{fast}$, where $\tau_{fast}$ is the duration of the fast discharge.

Figure 6:
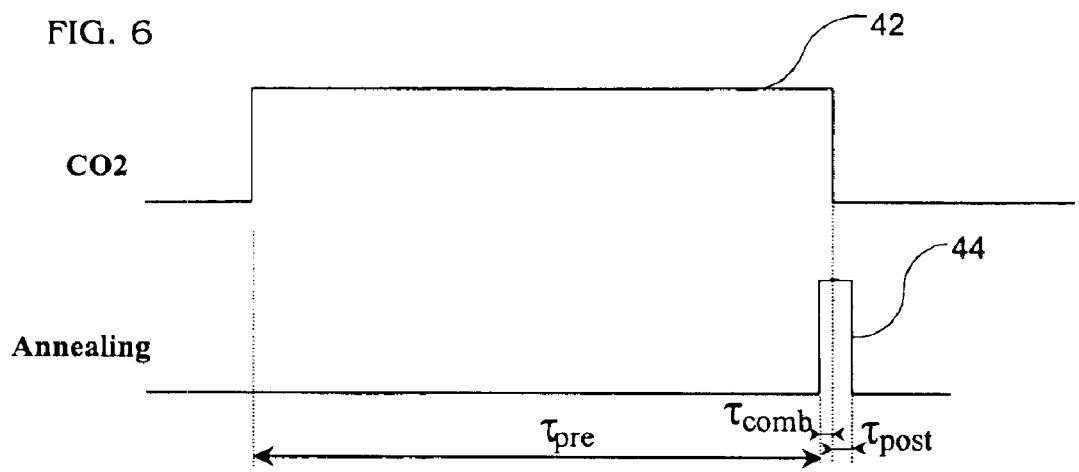
FIG. 6 illustrates a process sequence.

FIG. 6 schematically illustrates another embodiment of the present process. Two idealized laser pulses are shown. The $CO_2$ laser pulse 42 starts and heats the $SiO_2$ substrate. Some time before the $CO_2$ laser pulse ends the annealing source pulse 44 irradiates the Si layer to crystallize it. The time between the start of the $CO_2$ laser pulse and the start of the annealing source pulse, also known as the temporal offset ($\tau_{pre}$), can be used to establish the effective substrate temperature at the time of the annealing source pulse by referring to the temperature history of the substrate related to the laser pulse. The annealing source pulse 44 continues beyond the end of the $CO_2$ laser pulse. In this example, both the $CO_2$ laser pulse and the annealing source pulse are irradiating the same area at the same time for a period of combined irradiation, $\tau_{comb}$. During $\tau_{comb}$, it is possible for the molten-Si film to absorb energy from both the annealing source and the $CO_2$ laser. This is because although solid Si is practically transparent to IR radiation, molten-Si absorbs IR radiation. The total fluence of the two beams may need to be adjusted to avoid agglomeration of the Si film. The annealing source pulse may remain on for a period, $\tau_{post}$, after the $CO_2$ laser pulse has ended.

The annealing source pulse will temporally correspond approximately to the maximum effective substrate temperature if the annealing source pulse is timed to coincide with the end of the $CO_2$ laser pulse as shown in FIG. 5, or after the end of the $CO_2$ laser pulse while the temperature of the substrate and film continues to increase after the end of the $CO_2$ laser pulse. In an embodiment of the present method, the temporal offset is determined so that the annealing source pulse corresponds to approximately the maximum effective substrate temperature, and the maximum effective substrate temperature is controlled by adjusting the energy introduced into the substrate, which determines the temperature history. As discussed above, the energy introduced into the substrate by the $CO_2$ laser can be controlled by adjusting a number of factors. The instantaneous power could be adjusted in some embodiments. The beam area could be adjusted to increase or decrease the IPD and the fluence. The pulse duration could be used to vary the fluence separately from the IPD. The repetition rate, or the corresponding duty cycle, could be adjusted to control the average power density for multiple laser pulses, independent from the factors related to each individual pulse. And in the case of scanning applications the cumulative average power density of multiple scanned shots may be futher adjusted by varying the stepping distance relative to the beam dimension in the scanning direction.

Since the $CO_2$ laser pulse may be heating a localized region of the substrate to a temperature above its formal melting point, it is preferred to provide a spatial alignment of the optical annealing source and the $CO_2$ laser pulse to maximize the overlap of the two sources. In this manner the maximum thermal energy of the $CO_2$ laser pulse may be used so as to provide the desired benefit without introducing additional unused heat to the substrate. The formal melting point refers to the thermodynamic melting point of bulk material, which as discussed herein may be exceeded in a localized area for a short period of time without causing significant damage to the substrate.

With any of these pulse sequences, the rate of temperature change in the substrate is sufficiently slow relative to the annealing source that the substrate has a substantially constant substrate temperature over the approximately 10 ns–300 ns pulse duration of the annealing source plus the subsequent approximately 200 ns–500 ns for resolidification. This is apparent by reviewing the difference in the time scale between FIG. 1 and FIG. 3. Accordingly, it is possible to establish the effective substrate temperature using a given laser pulse from the laser heating source, for example the $CO_2$ laser, by determining the temporal offset ($\tau_{pre}$), corresponding to the desired substrate temperature based upon the temperature history of the substrate surface. Similarly, for a given temporal offset the $CO_2$ laser pulse sequence may be adjusted to achieve the desired substrate temperature at the time of the annealing source pulse. In the situation where a non-pulsed annealing source is used, the temperature may vary during the resolidification period while still remaining high enough to allow for lateral crystallization.

A range of values may be suitable for practicing one or more embodiments of the present method. The $CO_2$ pulse area is preferably matched to the annealing source beam area, although larger or smaller beams may be used. $CO_2$ pulse instantaneous power may be selected so as to provide a desired instantaneous power density based on the beam area used. The following ranges of values may be used as general guidelines:

$CO_2$ pulse duration: 5–1000 $\mu$s, preferably 5–100 $\mu$sec, or 5–30 $\mu$sec.

$CO_2$ beam area: 1 mm$^2$–1 cm$^2$ $CO_2$ pulse instantaneous power density: 50–150 W/mm²

$CO_2$ pulse fluence: 0.4–4 J/cm²; more preferably 0.4–1.5 J/cm²; even more preferably 0.4–1 J/cm².

Excimer pulse duration: 10–300 ns

Pulse frequency (f): 100–300 Hz.

Temporal offset ($\tau_{pre}$): 5–1500 μs

Figure 7:
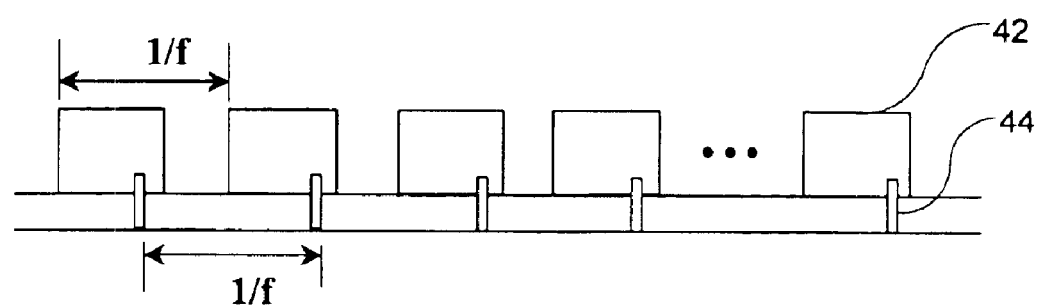
FIG. 7 illustrates a repeating process sequence.

FIG. 7 shows a repeating pulse sequence corresponding to that shown in FIG. 4 for purposes of a scanning crystallization process. The sequences shown in FIGS. 5 and 6 could be similarly repeated for use in scanning crystallization processes.

Crystallization of a 50-nm-thick silicon film on a fused silica substrate is possible using an excimer laser as the annealing source at approximately 240 mJ/cm², by employing a $CO_2$ laser heating source at between approximately 250–300 W, with a pulse duration of approximately 260 μs, and a beam area of approximately 5 mm×0.3–0.5 mm. The temporal offset between the $CO_2$ laser pulse and the excimer laser pulse was approximately 250 μs, with a repetition rate of 100 Hz for both lasers. This process used a direct solidification SLS process with a step size of 10 μm. Without the use of the $CO_2$ laser-heating source, an excimer laser fluence of between about 400 mJ/cm² and 500 mJ/cm² would typically be used.

Using a $CO_2$ laser heating source with a pulse duration of approximately 60 μs, a $CO_2$ beam approximately 1 mm×2 mm, at an instantaneous power of nominally 250 W, although peak power may not have been achieved due to the short pulse length, crystallization of 50-nm film on a glass substrate can be achieved using an excimer laser at a fluence of approximately 170 mJ/cm². A temporal offset between the $CO_2$ laser pulse and an excimer laser pulse of approximately 49 μs was used, at a repetition rate of 300 Hz for both the $CO_2$ laser pulse and the excimer laser pulse. A step size of approximately 35 μm was used to perform an M×N crystallization process, which refers to a process of crystallizing a region by taking M shots in a first direction and N shots in a second direction.

Crystallization of a 50-nm-thick silicon film on a glass substrate is possible using an excimer laser as the annealing source at approximately 140 mJ/cm², by employing a $CO_2$ laser-heating source at between approximately 250–300W, with a pulse duration of approximately 200 μs, and a beam area of approximately 5–10 mm² circular beam. The temporal offset between the $CO_2$ laser pulse and the excimer laser pulse was approximately 195 μs, with a repetition rate of 66 Hz for both lasers. This process used a direct solidification SLS process with a step size of approximately 5 μm. A 12 μm slit mask was used for the annealing source.

Accordingly, it is possible to crystallize silicon using optical annealing at an annealing source fluence below 350 mJ/cm². Although law fluence excimer laser pulses were described in the preceding examples, other sources at similar fluence ranges will work as well.

Several embodiments of the present process have been described. Since modification of these processes will be apparent to those of ordinary skill in the art, the following claims shall not be limited to any specific embodiment.

What is claimed is:

1. A process of lateral crystallization comprising:
   providing a silicon film on a substrate surface;
   exposing a localized substrate region at the substrate surface to a laser heating source; and
   annealing a portion of the silicon film in thermal contact with the localized substrate region by exposing the silicon film to an optical annealing source with a fluence of less than 350 mJ/cm².

2. The process of claim 1, wherein the substrate surface is $SiO_2$, and the laser heating source has an optical wavelength of between approximately 9 and 11 μm.

3. The process of claim 2, wherein the laser heating source is a $CO_2$ laser.

4. The process of claim 3, wherein the $CO_2$ laser has a pulse duration of between approximately 0.01 milliseconds and 1 millisecond.

5. The process of claim 1, wherein the optical annealing source is a excimer laser.

6. The process of claim 5, wherein the excimer laser is a XeCl laser or a KrF laser.

7. The process of claim 5, wherein the excimer laser has a pulse duration of between approximately 30 nanoseconds and 300 nanoseconds.

8. The process of claim 1, wherein the optical annealing source is a solid-state laser.

9. The process of claim 8, wherein the solid-state laser is a frequency-doubled Nd-YAG laser or a frequency-doubled Nd-$YVO_4$ laser.

10. The process of claim 8, wherein the solid state laser is a frequency-tripled Nd-YAG laser or a frequency-tripled Nd-$YVO_4$ laser.

11. The process of claim 1, wherein the optical annealing source is a UV lamp.

12. The process of claim 11, wherein the UV lamp is a high-pressure mercury arc lamp or a high-pressure mercury-xenon arc lamp.

13. The process of claim 11, wherein the UV lamp is chopped to produce pulses less than 100 nanoseconds FWHM.

14. The process of claim 11, wherein the UV lamp is continuous.

15. The process of claim 1, wherein the optical annealing source has a fluence between about 200 mJ/cm² and 300 mJ/cm².

16. The process of claim 1, wherein the optical annealing source has a fluence between about 100 mJ/cm² and 200 mJ/cm².

17. The process of claim 1, wherein the optical annealing source has a fluence of between 130 mJ/cm² and 150 mJ/cm².

18. A process of lateral crystallization comprising:
   providing a silicon film in thermal contact with a substrate;
   exposing a portion of the silicon film to a continuous optical source at a fluence that is insufficient to even partially melt the silicon film by itself; and
   exposing a portion of the $SiO_2$ layer in thermal contact with the portion of the silicon film to a $CO_2$ laser pulse with a duration of between approximately 0.01 milliseconds and 1 millisecond such that the exposed portion of the $SiO_2$ layer is heated until a substrate temperature is reached that enables the combined energy of the continuous optical source and the CO2 laser pulse to completely melt the portion of the silicon film exposed by the continuous optical source, whereby the portion of the silicon film is crystallized.

19. The process of claim 16, wherein the continuous optical source is a UV lamp.

* * * * *